US011959955B2

(12) United States Patent
Berry et al.

(10) Patent No.: US 11,959,955 B2
(45) Date of Patent: Apr. 16, 2024

(54) ENHANCED ANECHOIC CHAMBER

(71) Applicant: Argo AI, LLC, Pittsburgh, PA (US)

(72) Inventors: Jonathan C. Berry, San Jose, CA (US); Duc H. Vu, Sunnyvale, CA (US)

(73) Assignee: Argo AI, LLC, Pittsburgh, PA (US)

( * ) Notice: Subject to any disclaimer, the term of this patent is extended or adjusted under 35 U.S.C. 154(b) by 498 days.

(21) Appl. No.: 17/027,489

(22) Filed: Sep. 21, 2020

(65) Prior Publication Data

US 2022/0091170 A1 Mar. 24, 2022

(51) Int. Cl.
*G01R 29/10* (2006.01)
*G01S 7/40* (2006.01)
*G01S 13/931* (2020.01)

(52) U.S. Cl.
CPC .......... *G01R 29/105* (2013.01); *G01S 7/4052* (2013.01); *G01S 13/931* (2013.01)

(58) Field of Classification Search
CPC . G01R 29/105; G01R 29/0821; G01S 7/4052; G01S 13/931; G01S 7/4086;
(Continued)

(56) References Cited

U.S. PATENT DOCUMENTS 3,806,943 A     4/1974   Holloway
4,823,132 A *   4/1989   Platt ........................ G01S 3/026
                                                             434/2

(Continued)

FOREIGN PATENT DOCUMENTS

CN        1905422 A     1/2007
CN    110907738 A     3/2020
(Continued)

OTHER PUBLICATIONS

W. Duan et al., "A composite electromagnetic absorber for anechoic chambers," 2013 Proceedings of the International Symposium on Antennas & Propagation, Nanjing, China, 2013, pp. 412-414. (Year: 2013).*

(Continued)

*Primary Examiner* — Bernarr E Gregory
*Assistant Examiner* — Hailey R Le
(74) *Attorney, Agent, or Firm* — Fox Rothschild LLP (57) ABSTRACT

Devices, systems, and methods are provided for an enhanced anechoic chamber. An enhanced anechoic chamber device may operate a gimbal setup attached to a mounting arm of an anechoic chamber and a radar under test to modify an azimuth angle and an elevation angle of a radar under test. The enhanced anechoic chamber device may cause the radar under test to transmit one or more signals towards one or more reflectors situated in a field of view of the radar through an aperture of an anechoic chamber, wherein the one or more reflectors are situated outside the anechoic chamber. The enhanced anechoic chamber device may receive reflected signals from the one or more reflectors at the radar under test, wherein the reflected signals pass through the aperture before reaching the radar under test. The enhanced anechoic chamber device may measure signal energy of at least one of the reflected signals. The enhanced anechoic chamber device may generate an output indicating an operational status of the radar under test.

17 Claims, 7 Drawing Sheets

(58) Field of Classification Search
CPC .......... G01S 7/4004; G01S 7/40; G01S 7/497;
H01Q 15/18; E04B 1/34336; E04B 1/82;
E04H 1/1205; G10K 11/20
USPC ........................................................ 342/173
See application file for complete search history.

(56) References Cited

U.S. PATENT DOCUMENTS

| | | | |
|---|---|---|---|
| 5,134,405 A | 7/1992 | Ishihara et al. | |
| 5,594,218 A * | 1/1997 | Diaz .................. | G01R 29/0828 181/295 |
| 6,731,236 B1 | 5/2004 | Hager et al. | |
| 6,842,013 B1 | 1/2005 | Meloling et al. | |
| 7,102,562 B2 | 9/2006 | Moller et al. | |
| 7,667,467 B2 * | 2/2010 | Khosravi .......... | G01R 29/105 343/700 R |
| 2003/0034444 A1 | 2/2003 | Chadwick et al. | |
| 2004/0075443 A1 * | 4/2004 | Hemming .......... | G01R 29/0821 324/637 |
| 2010/0109932 A1 * | 5/2010 | Liu ...................... | H01Q 19/022 342/1 |
| 2011/0298673 A1 | 12/2011 | Zhang | |
| 2013/0257638 A1 | 10/2013 | He | |
| 2014/0300519 A1 | 10/2014 | Estebe et al. | |
| 2017/0018912 A1 * | 1/2017 | Loebowitz ............... | H05K 5/03 |
| 2018/0321292 A1 | 11/2018 | Bartko et al. | |
| 2019/0361064 A1 * | 11/2019 | Rowell .............. | G01R 29/105 |
| 2020/0177289 A1 * | 6/2020 | Maruo ................ | G01R 29/105 |
| 2020/0212589 A1 * | 7/2020 | Cobb .................... | G01S 7/4052 |
| 2020/0266518 A1 * | 8/2020 | Li ............................ | H01Q 1/22 |
| 2022/0075056 A1 * | 3/2022 | Esmail .................... | H01Q 1/28 |

FOREIGN PATENT DOCUMENTS

| | | | |
|---|---|---|---|
| EP | 3812790 A1 * | 4/2021 | .......... G01S 13/931 |
| JP | 2006170836 A | 6/2006 | |
| RU | 2606341 C1 | 1/2017 | |
| WO | WO-9600992 A1 * | 1/1996 | .......... H01Q 17/008 |

OTHER PUBLICATIONS

T. Hayashi, S. Inoue, K. Shimada and M. Tokuda, "Anechoic chamber using foamed ferrite for immunity tests in the frequency range over 1 GHz," 1999 International Symposium on Electromagnetic Compatibility (IEEE Cat. No.99EX147), Tokyo, Japan, 1999, pp. 256-259, doi: 10.1109/ELMAGC.1999.801312. (Year: 1999).*
A. E. Assal, R. Benzerga, A. Sharaiha, A. Harmouch and A. Jrad, "Multilayer Absorber Based on Carbon Fibers Loaded Epoxy Foam," 2019 URSI Asia-Pacific Radio Science Conference (AP-RASC), New Delhi, India, 2019, pp. 1-1, doi: 10.23919/URSIAP-RASC.2019.8738390. (Year: 2019).*
Ron Sauerman et al., "A Compact Antenna Test Range Built To Meet The Unique Testing Requirements For Active Phased Array Antennas", retrieved from the internet, <URL:https://www.nsi-mi.com/images/Technical_Papers/1999/A%620Compact%20Antenna%20Test%20Range%20Built%20to%20Meet%20the%20Unique%20Testing%20Requirements%20for%20Active%20Phased%20Array%20Antennas.pdf>, [retrieved on Nov. 25, 2019], 4 pages.
Extended European Search Report of European application No. 21197122.1 dated Feb. 9, 2022, 8 pages.
F. Comblet, "Radar Cross Section Measurements in an Anechoic Chamber: Description of an Experimental System and Post Processing", 2014 IEEE Conference on Antenna Measurements & Applications (CAMA), Jan. 8, 2015, pp. 1-4, IEEE, New York, NY.

* cited by examiner

ENHANCED ANECHOIC CHAMBER

TECHNICAL FIELD

This disclosure generally relates to systems and methods for an enhanced anechoic chamber.

BACKGROUND

Some vehicles are equipped with a sensor system to collect data relating to the current and developing state of the vehicle's surroundings. The proper performance of a vehicle depends on the accuracy data collected by the sensors in the sensor system. The sensor system may comprise radars, visual spectrum cameras, laser-ranging devices (LIDARs), thermal sensors, or other types of sensors. The sensor system enables a vehicle to detect objects and obstacles in the vicinity of the vehicle and tracks the velocity and direction of pedestrians, other vehicles, traffic lights, or similar objects in the environment around the vehicle.

However, disoriented sensors may capture unreliable data. Therefore, there is a need to enhance the proper orientation of sensors to ensure that captured data does not undermine the sensor system performance.

Certain implementations will now be described more fully below with reference to the accompanying drawings, in which various implementations and/or aspects are shown. However, various aspects may be implemented in many different forms and should not be construed as limited to the implementations set forth herein; rather, these implementations are provided so that this disclosure will be thorough and complete, and will fully convey the scope of the disclosure to those skilled in the art. Like numbers in the figures refer to like elements throughout. Hence, if a feature is used across several drawings, the number used to identify the feature in the drawing where the feature first appeared will be used in later drawings.

DETAILED DESCRIPTION

Sensors may be located at various positions on an autonomous vehicle. These sensors may include LIDAR sensors, stereo cameras, radar sensors, thermal sensors, or other sensors attached to an autonomous vehicle. These sensors may be originally used in a lab environment to perform high precision analyses of their performance under certain conditions. Autonomous vehicles may be driven in the real world and rely on the attached sensors to perform to a certain performance level under environmental factors. As the autonomous vehicles are driven in the real world, sensors such as radar rely on accurate detection of signals reflected from objects in the vicinity of the autonomous vehicle. A problem may exist in the uncertainty of radar elevation angle detection when it is mounted, for example, to a vehicle. Radar alignment uncertainty can lead to radar data uncertainty. For example, an accurate radar elevation angle helps to detect objects at a distance optimal for that radar. However, if radar elevation angle detection is flawed due to being off by some degrees, objects will be detected at a reduced distance.

Radar uncertainty would be due to possible secondary reflections off of other objects present in the vicinity of the corner reflector. For example, a signal from the radar may hit the ground or wall first then bounce off to the corner reflector, which reflects that signal back to the radar. This may cause the energy levels of the signal to drop or even increase depending on whether the reflected signals add either in phase or out of phase to each other.

Azimuthal alignment errors can be detected with direct radar Angle-of-Arrival direction estimation right out of the radar when a particular target's relative angle is already known. Other means of measuring a radar elevation angle (also known as a radar pitch angle) may include measurements by some means of laser scanning or some mechanical measurement. However, that is feasible when the radar is not covered by a fascia or other vehicle material. It is an objective to measure an elevation angle of the radar without making changes to the vehicle. It is desirable to determine a radar's elevation angle by analyzing the radar output with its surrounding.

Example embodiments described herein provide certain systems, methods, and devices for enhanced anechoic chamber.

In one or more embodiments, an enhanced anechoic chamber system may facilitate means of validating a radar elevation angle based on characterizing a number of signal energy values associated with a radar's reception of feedback signals received from a reflective structure.

In one or more embodiments, an enhanced anechoic chamber system may facilitate an anechoic chamber that is portable and capable of accepting a radar under test situated inside it but still be capable of testing at a greater range. That is, the anechoic chamber may not be limited to testing only within the anechoic chamber. Currently, anechoic chambers may be large enough to hold a sensor/emitter under test and the objects being tested for measurements. For example, the enhanced anechoic chamber system may facilitate that the anechoic chamber can be in the range of 3 to 6 feet in height and width. Further, the anechoic chamber may comprise wheels for ease of transportation and movements. The anechoic chamber can be easily picked up by a forklift and moved around where it is needed. In some examples, the anechoic chamber may fit into service elevators to move it from one floor to another. It should be understood that although the dimensions are given as an example, these dimensions are meant for illustrative purposes and that other dimensions and shapes may be used for the anechoic chamber.

In one or more embodiments, an enhanced anechoic chamber system may facilitate that the shape of the anechoic chamber is selected to avoid a presence of any 90° angles. This is because if normal walls are used, this may result in every corner becoming a corner reflector. Ideally, a spherical shape of the anechoic chamber may result in no angles that may become reflectors. However, implementations may vary, but the purpose is to minimize the presence of any 90° angles.

In one or more embodiments, an enhanced anechoic chamber system may facilitate that the anechoic chamber may comprise an aperture allowing signals to the transmitted from the radar to one or more reflectors that may be placed at a larger distance than the anechoic chamber. A corner reflector or other radar target can then be placed some distance from the anechoic chamber, ideally centered in the radar's field of view (FOV) through the aperture. Instead of building a chamber that encloses the complete testing set up, which may become too large, the enhanced anechoic chamber system may facilitate testing of a sensor/emitter (e.g., a radar, LIDAR, cameras, thermal sensors, etc.) using one or more reflectors (e.g., one or more corner reflectors) that may be placed at a greater distance than the enclosure of the anechoic chamber.

In one or more embodiments, an enhanced anechoic chamber system may facilitate the use of one or more reflectors (e.g., one or more corner reflectors) placed at a certain location relative to a radar under test that is placed inside the portable anechoic chamber. A corner reflector consists of three mutually perpendicular, intersecting flat surfaces, which reflect waves directly towards the source. The three intersecting surfaces often have square shapes. Radar corner reflectors made of metal are used to reflect radio waves from radar sets. Optical corner reflectors, called corner cubes, made of three-sided glass prisms, are used in surveying and laser ranging. When the corner reflector is not directly facing the radar, and as the corner reflector turns away from the radar, it causes the corner reflector to turn off because it becomes far less reflecting. It should be understood that the corner reflector is used throughout this disclosure for illustrative purposes and is not limiting to only that type of reflector. Other reflectors may be used to test a sensor that may be placed within the anechoic chamber.

In one or more embodiments, an enhanced anechoic chamber system may facilitate using one or more reflectors (e.g., one or more corner reflectors, or other types of reflectors), each having a front reflective face surrounded by anechoic foam. The anechoic may help to absorb radio waves or signals received from the radar. A corner reflector may be placed at a different elevation and distance from the radar under test while the radar under test is placed inside the portable anechoic chamber. In one or more embodiments, an enhanced anechoic chamber system may facilitate capturing data associated with signals received at the radar, based on reflected waves from the corner reflector. The reflected waves may first go through an aperture of the portable anechoic chamber that is located between the radar and the one or more corner reflectors.

In one or more embodiments, an enhanced anechoic chamber system may facilitate that the aperture may be a narrow (e.g., in the range of centimeters) opening. This way, the majority of multipath and other distracters from these measurements are minimized due to the narrow size of the aperture. The corner reflector may be placed in the distance in front of a large wall of anechoic foam, in order to only allow reflections of signals coming from the corner reflector and not from what is next to the corner reflector.

In one or more embodiments, an enhanced anechoic chamber system may facilitate that the aperture of the anechoic chamber may allow the detection of objects at a certain distance from the radar without the need to have the object within the anechoic chamber. In some embodiments, the aperture may be an opening that is surrounded by anechoic foam in order to minimize the diffracted effect of the edge (e.g., edge diffraction). Having foam covering the edges of the aperture may cause the edge to become blurred in the RF propagation path, which reduces the edge diffraction. The anechoic phone may be a black open-cell foam impregnated with absorbent material (e.g., carbon compound). The anechoic phone may be resistive, such that radio waves that induced current on the foam, which may cause reflection, get turned into heat before these radio waves reflect, resulting in a reduced amount of reflection.

In one or more embodiments, an enhanced anechoic chamber system may facilitate that inside the anechoic chamber, there may be a mounting arm, at the end of which there may be a gimbal setup so that one or more motors may control the movement of the radar in various directions. For example, a gimbal setup may facilitate moving the radar in the elevation axis and the azimuth axis. These variations in various angles may allow building a map or sensitivity chart of the radar based on returns from a reflector outside the anechoic chamber.

In one or more embodiments, an enhanced anechoic chamber system may allow performing a series of measurements on the radar under test by varying the elevation angle and/or the azimuth angle based on one or more reflectors being placed at a particular position outside of the anechoic chamber. An enhanced anechoic chamber system may facilitate generating a radar performance pattern as a complete function of azimuth and elevation. A radar vendor may provide some information, but that information may not be complete. The enhanced anechoic chamber system may facilitate determining how a radar performs in different azimuth and elevation angles.

In one or more embodiments, an enhanced anechoic chamber system may facilitate the use of a computer system to control the gimbal that rotates the radar in the various directions. One or more specific tests may be taken by generating a testing script to be run by the computer system. For example, an administrator of the anechoic chamber may decide to perform a set of measurements at a certain azimuth angle and a certain elevation. The computer system may control the get involved to vary the rotation of the radar to that certain azimuth and elevation angles. When the radar is at that coordinate, the computer system may activate the radar in order to transmit and capture return signals. This process may be repeated to create a series of measurements at different azimuth and elevation angles.

In one or more embodiments, an enhanced anechoic chamber system may perform signal measurements by varying the radar elevation angle by certain degrees to map out points on a curve resulting in an energy pattern. These measurements may be signal energy values associated with a radar's reception of feedback signals received from a reflective structure. An average energy pattern may be generated based on the measurements. The average energy pattern may become a baseline for validating the radar elevation angle of a radar under test. In one or more embodiments, an enhanced anechoic chamber system may determine the position of a corner reflector. For example, a first corner reflector on the reflection structure may be located at a first distance and a first height relative to the radar under test. Based on that information, a radar under test may be validated by determining whether its radar elevation angle is what it is expected to be for that location of the corner reflector and the elevation and spacing of the radar under test from the corner reflector.

In one or more embodiments, an enhanced anechoic chamber system may facilitate one or more mechanisms to verify a radar's performance. For example, the enhanced anechoic chamber system may generate radar sensitivity maps, which may be used to build one or more lookup tables. Statistical variations may be observers from radar to radar. The enhanced anechoic chamber system may also facilitate comparing radar performances, and verifying the radar performance against the vendors indicated expected levels of performance of the radar.

In one or more embodiments, an enhanced anechoic chamber system may use two or more reflectors to perform testing. For example, while a radar under test is installed inside the anechoic chamber, a first reflector may be fixed, and another reflector may move on a cable or other means to make that reflector transition in a certain direction. This may allow testing of the radar's performance to determine its range resolution. The two reflectors may provide two targets at different ranges. The anechoic chamber may help collect data from the reflected signals from both targets to determine how close these reflectors can be to each other before the radar under test can no longer tell them apart.

In one or more embodiments, an enhanced anechoic chamber system may facilitate performing angular separation measurements. For example, using two reflectors as targets to reflect signals received from a radar under test inside the portable anechoic chamber may allow measurements that may verify that the reflected signals are coming from both reflectors. Angular separation measurement may determine the point at which the reflected signals appear to the radar under test as one return signal.

In one or more embodiments, an enhanced anechoic chamber system may facilitate testing a radar by placing a fascia material in front of it inside the portable anechoic chamber. For example, any type of vehicle or material that may be placed in front of a radar in the real world may also be used in the anechoic chamber in front of the radar under test. The enhanced anechoic chamber system may then take measurements to determine the performance of the radar under test under this condition. Some examples of material that may be found in the real-world application of a vehicle or radar include windshield glass, bumper material, or even debris. The enhanced anechoic chamber system may help determine how much, if at all, does not object placed in front of the radar under test distort the radar's performance. The material may be mounted in front of the radar under test such that the gimbal controlling the movements may control both its radar under test and fascia as one unit moving in space. Tests may be taken of reflected signal measurements, which may allow for before and after measurements while having the material in front of the radar and comparing that to measurements while the material is removed.

In one or more embodiments, an enhanced anechoic chamber system may facilitate the use of a digital target simulator instead of the Aperture. In this case, the digital target simulator may take radar signals received from a radar and then records them into a circular memory. The digital target simulator may then read off a certain phase behind the signal received from the radar, which produces a slight delay between the recording of the received signal and a reflected signal. The digital target simulator may then play that signal back and reflect it towards the radar.

The above descriptions are for purposes of illustration and are not meant to be limiting. Numerous other examples, configurations, processes, etc., may exist, some of which are described in greater detail below. Example embodiments will now be described with reference to the accompanying figures.

Figure 1:
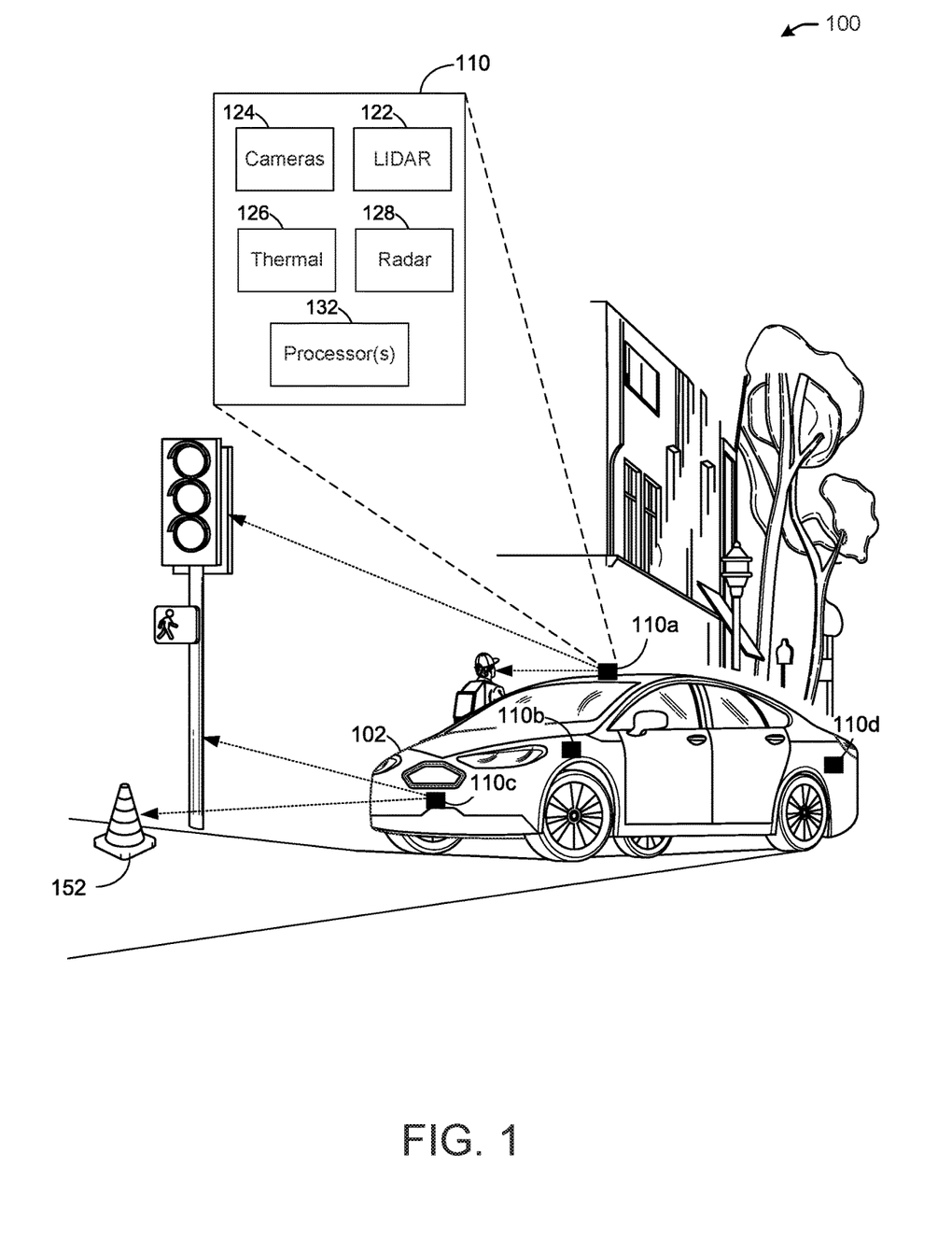
FIG. 1 illustrates an example environment of a vehicle, in accordance with one or more example embodiments of the present disclosure.

FIG. 1 illustrates example environment 100 of a vehicle 102, in accordance with one or more example embodiments of the present disclosure.

Referring to FIG. 1, there is shown a vehicle 102 having a sensor system 110 for a plurality of cameras, emitters, and sensors. The sensor system 110 may be connected to the vehicle 102. In this environment 100, there is shown that sensor system 110 includes sensors such as sensors 110a, 110b, 110c, and 110d. It should be noted that other sensors not shown in this figure may also be attached to the vehicle 102 and that the sensors 110a, 110b, 110c, and 110d are used for illustrative purposes. These sensors may detect objects (e.g., object 152) in the vicinity and around the vehicle 102. Other emitters and sensors in the sensor system 110 may transmit and/or receive one or more signals in order to detect and/or capture information associated with objects in the vicinity and around the vehicle 102. For example, a LIDAR sensor may transmit a LIDAR signal (e.g., light or an electromagnetic wave), a radar uses radio waves in order to determine distances between the vehicle and objects in the vicinity of the vehicle, and a thermal sensor may capture temperature (e.g., based on an emitted and detected infrared signal or other laser signals).

In one or more embodiments, the sensor system 110 may include LIDAR 122. Some examples of a LIDAR, such as Geiger mode LIDAR, ground-based LIDAR, large footprint LIDAR, small footprint LIDAR, or the like. The sensor system 110 may include cameras 124, such as stereo cameras that may capture images in the vicinity of the vehicle 102. The sensor system 110 may include a thermal sensor 126, such as thermistors, resistance temperature detectors, thermocouples, semiconductors, or the like. Further, the sensor system may include a radar 128, which may be any radar that uses radio waves to capture data from objects surrounding the vehicle 102. The sensor system 110 may also include one or more processor(s) 132. The one or more processor(s) 132 may control the transmission and reception of signals using the LIDAR 122, the cameras 124, the thermal sensor 126, and the radar 128. The various sensors of the sensor system 110, when calibrated correctly, should indicate a proper distance and shape of object 152. However, the vehicle 102 may be subjected to environmental conditions such as vibration, thermal shock, or similar conditions. Under such conditions, the various sensors of the sensor system 110 may fall out of alignment. This would result in the data received from these various sensors to be unreliable when processed by processor(s) 132.

It is understood that the above descriptions are for purposes of illustration and are not meant to be limiting.

Figure 2:
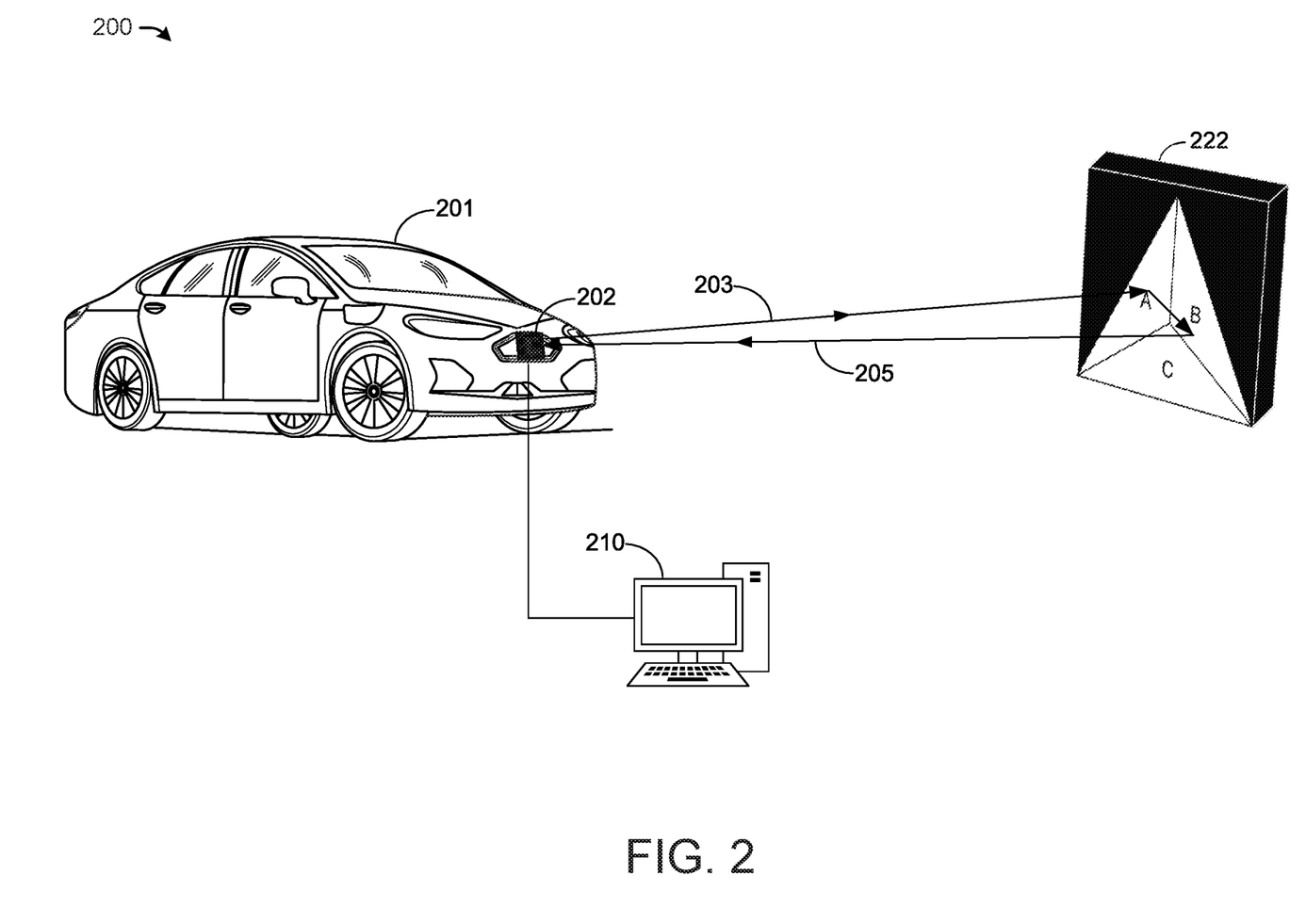
FIG. 2 depicts an illustrative schematic diagram for an enhanced anechoic chamber, in accordance with one or more example embodiments of the present disclosure.

FIG. 2 depicts an illustrative schematic diagram 200 for an enhanced anechoic chamber, in accordance with one or more example embodiments of the present disclosure.

Referring to FIG. 2, there is shown a vehicle 201 having a radar under test 202 facing a corner reflector 222. The radar under test 202 may transmit a signal 203 towards the corner reflector 222. The corner reflector 222 may consist of three mutually perpendicular, intersecting flat surfaces (e.g., surfaces A, B, C). The corner reflector 222 may reflect waves back towards the source (e.g., the radar under test 202). The three intersecting surfaces A, B, and C, often have square shapes. Radar corner reflectors may be made of metal are used to reflect radio waves from radar sets. For example, as seen in FIG. 2, and echoed or reflected signal 205 may be returned to the radar under test 202. When the signal 203 is transmitted towards the corner reflector 222, the signal 203 bounces off of the surface A towards surface B before being reflected back as a reflected signal 205.

Signal loss may occur due to misalignment or disorientation of the radar elevation angle when facing the corner reflector 222. In some scenarios, the radar under test 202 may be situated at a particular elevation and a particular distance from the corner reflector 222. In addition, the radar under test 202 may need to be validated based on the reflected signal 205. Increased signal loss may indicate that the radar elevation angle of the radar under test 202 may not be pointed towards its maximum point of radiation, which is at an elevation angle of zero degrees.

In one or more embodiments, it is assumed that the radar under test 202 has an energy pattern that includes a maximum point of radiation at an elevation angle of zero degrees, such that, the general, pattern tapers off as the elevation angle increases or decreases. It is further assumed that in general radars that are used in an application such as a vehicle have similar energy patterns such that they follow the same trend, and the maximum radiation is approximately at the same location on the energy pattern.

In one or more embodiments, the radar under test 202 may collect data associated with the reflected signal 205. The data may be in the form of signal energy (e.g., signal to noise ratio (SNR) data, received signal strength indicator (RSSI), or other means of measuring signal energy levels) or any other data representing the reflected signal 205. This data may be captured by computer system 210. The computer system 210 may comprise an enhanced anechoic chamber module for evaluating whether the radar under test 202 passes a validation threshold. In one example, where a baseline lookup table is used, which may be collected based on varying the elevation and azimuth angles of the radar and collecting a number of measurement over a plurality of tests that may be averaged in order to generate a set of data that become a baseline to compare other measurements to that baseline. It should be understood that using a baseline lookup table is only one example.

It is understood that the above descriptions are for purposes of illustration and are not meant to be limiting.

Figure 3:
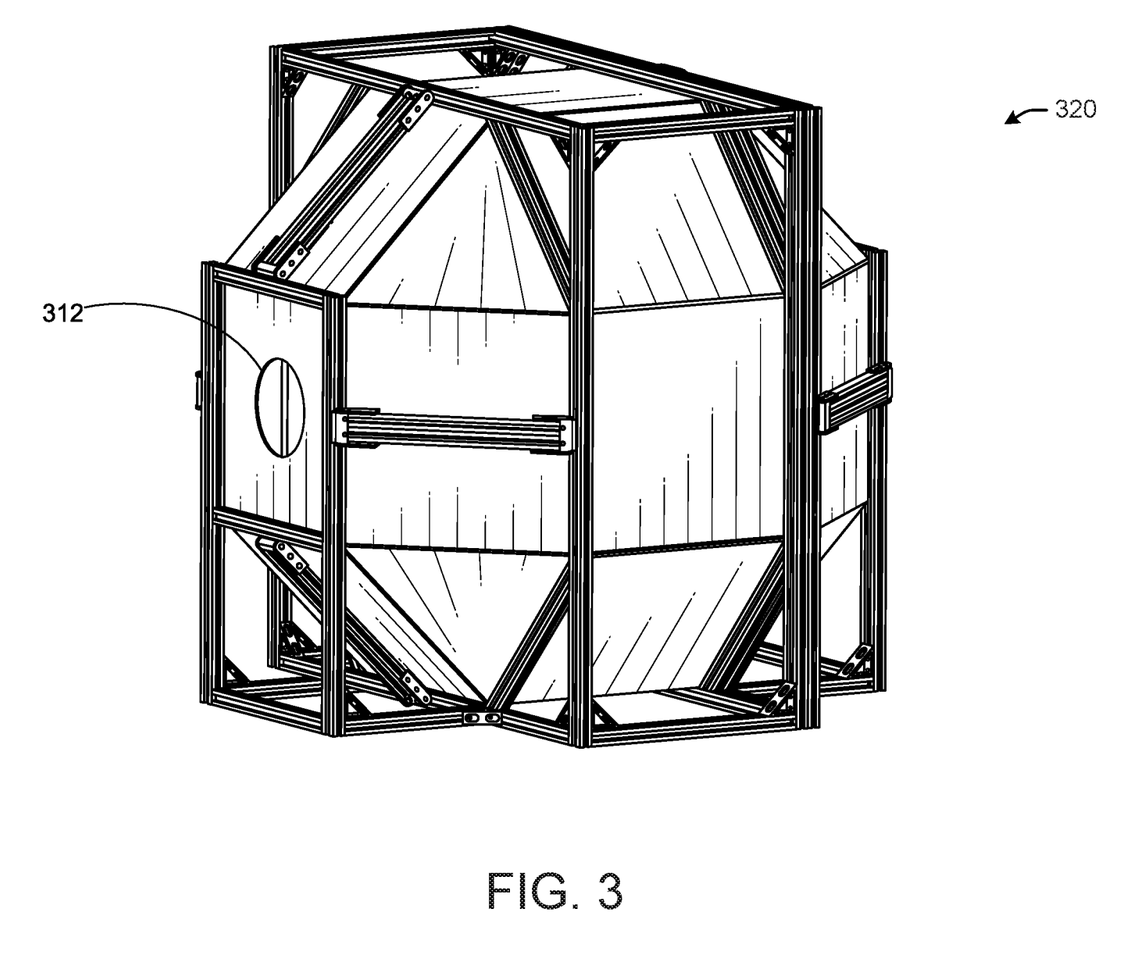
FIG. 3 depicts an illustrative schematic diagram for an enhanced anechoic chamber, in accordance with one or more example embodiments of the present disclosure.

FIG. 3 depicts an illustrative schematic diagram for an enhanced anechoic chamber, in accordance with one or more example embodiments of the present disclosure.

Referring to FIG. 3, there is shown an anechoic chamber 320. The anechoic chamber 320 may be portable and capable of accepting a sensor to be tested (e.g., a radar, LIDAR, camera, etc.) situated inside the anechoic chamber 320 but still be capable of testing at a greater range. That is, the anechoic chamber 320 may not be limited to testing only within the anechoic chamber. Currently, anechoic chambers may be large enough to hold a sensor/emitter under test and the objects being tested for measurements. For example, the anechoic chamber 320 can be in the range of 3 to 6 feet in height and width. Further, the anechoic chamber may comprise wheels for ease of transportation and movements. The anechoic chamber can be easily picked up by a forklift and moved around where it is needed. In some examples, the anechoic chamber may fit into service elevators to move it from one floor to another. It should be understood that although the dimensions are given as an example, these dimensions are meant for illustrative purposes and that other dimensions and shapes may be used for the anechoic chamber.

In one or more embodiments, the shape of the anechoic chamber 320 may be selected to avoid a presence of any 90° angles. This is because if normal walls are used, this may result in every corner becoming a corner reflector. Ideally, a spherical shape of the anechoic chamber may result in no angles that may become reflectors. However, implementations may vary, but the purpose is to minimize the presence of any 90° angles.

In one or more embodiments, the anechoic chamber 320 may comprise an aperture 312, allowing signals to the transmitted from the radar to one or more reflectors that may be placed at a larger distance than the anechoic chamber 320. Instead of building a chamber that encloses the complete testing set up, which may become too large, the anechoic chamber 32 may facilitate testing of a sensor/emitter (e.g., a radar, LIDAR, cameras, thermal sensors, etc.) using one or more reflectors (e.g., one or more corner reflectors) that may be placed at a greater distance than the enclosure of the anechoic chamber 320.

In one or more embodiments, the anechoic chamber 320 may be made up of one or more walls with attached together to result in an opaque structure, where the material used for the laws may render the anechoic chamber 320 to be structurally stable (e.g., PolyMetal™ sheets, or other material) that may provide good performance as a conductive material when it is used with anechoic foam. The walls may all be covered with an anechoic foam attached to the inside of the anechoic chamber 320. The anechoic chamber 320 may also be enclosed within an extruded aluminum structure to provide additional support and to make the anechoic chamber portable.

It is understood that the above descriptions are for purposes of illustration and are not meant to be limiting.

Figure 4:
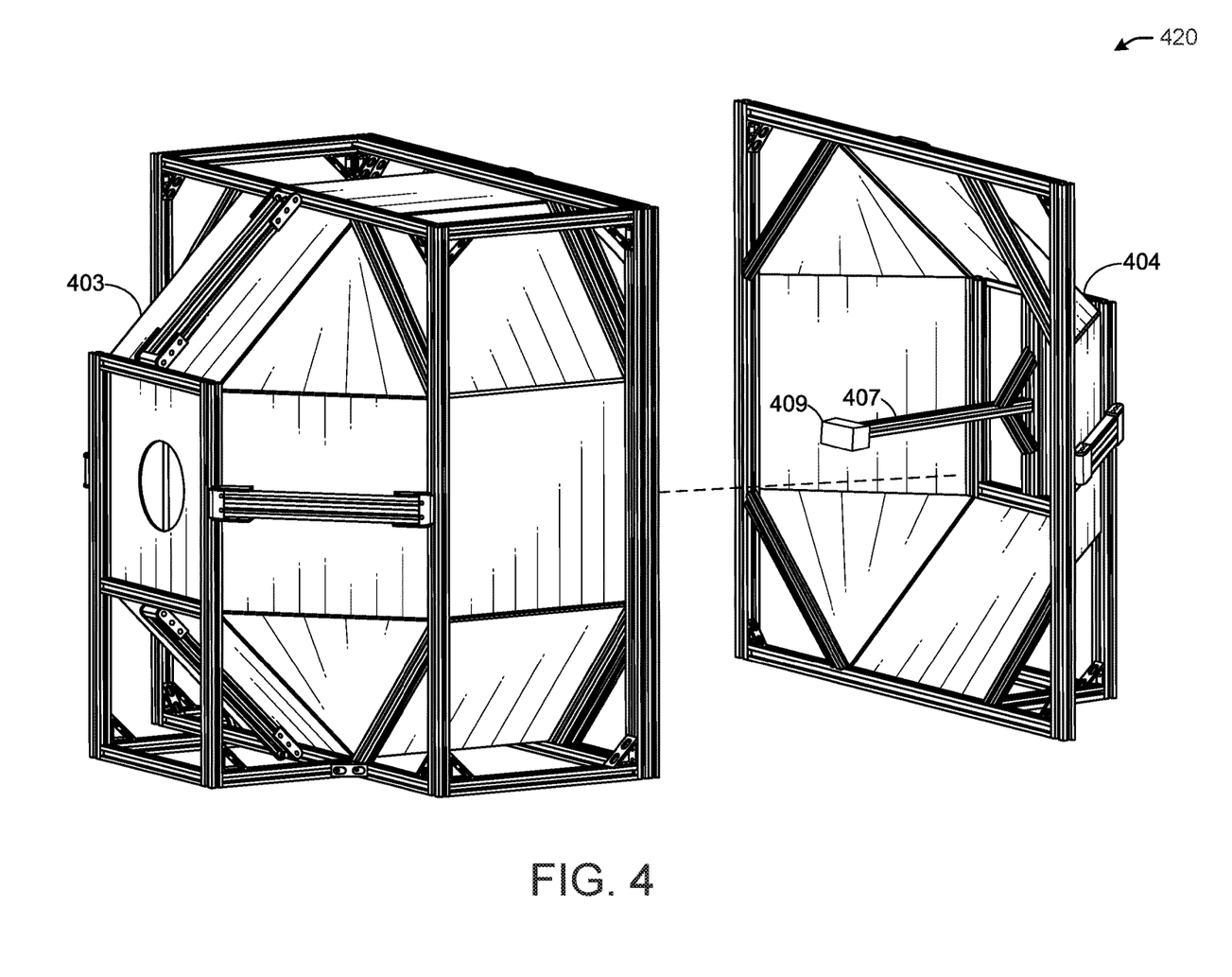
FIG. 4 depicts an illustrative schematic diagram for an enhanced anechoic chamber, in accordance with one or more example embodiments of the present disclosure.

FIG. 4 depicts an illustrative schematic diagram for an enhanced anechoic chamber, in accordance with one or more example embodiments of the present disclosure.

Referring to FIG. 4, there is shown an illustrative anechoic chamber 420 that may be comprised of one or more portions (e.g., portion 403 and portion 404). Portions 403 and 404 may come apart to allow access to the interior of the anechoic chamber. A system operator of the anechoic chamber 420 may separate portions 403 and 404 in order to set up various radars on the mounting arm 407. Other adjustments may be performed to the interior of the anechoic chamber 420 when the portions 403 and 404 are separated. The separation of these portions may also make the anechoic chamber 420 easier to transport.

In one or more embodiments, the anechoic chamber may comprise a mounting arm 407, at the end of which there may be a gimbal setup 409 so that one or more motors may control the movement of the radar in various directions. For example, a gimbal setup 409 may facilitate moving the radar in the elevation axis and the azimuth axis. These variations in various angles may allow building a map or sensitivity chart of the radar based on returns from a reflector outside the anechoic chamber. It is understood that the above descriptions are for purposes of illustration and are not meant to be limiting.

Figure 5:
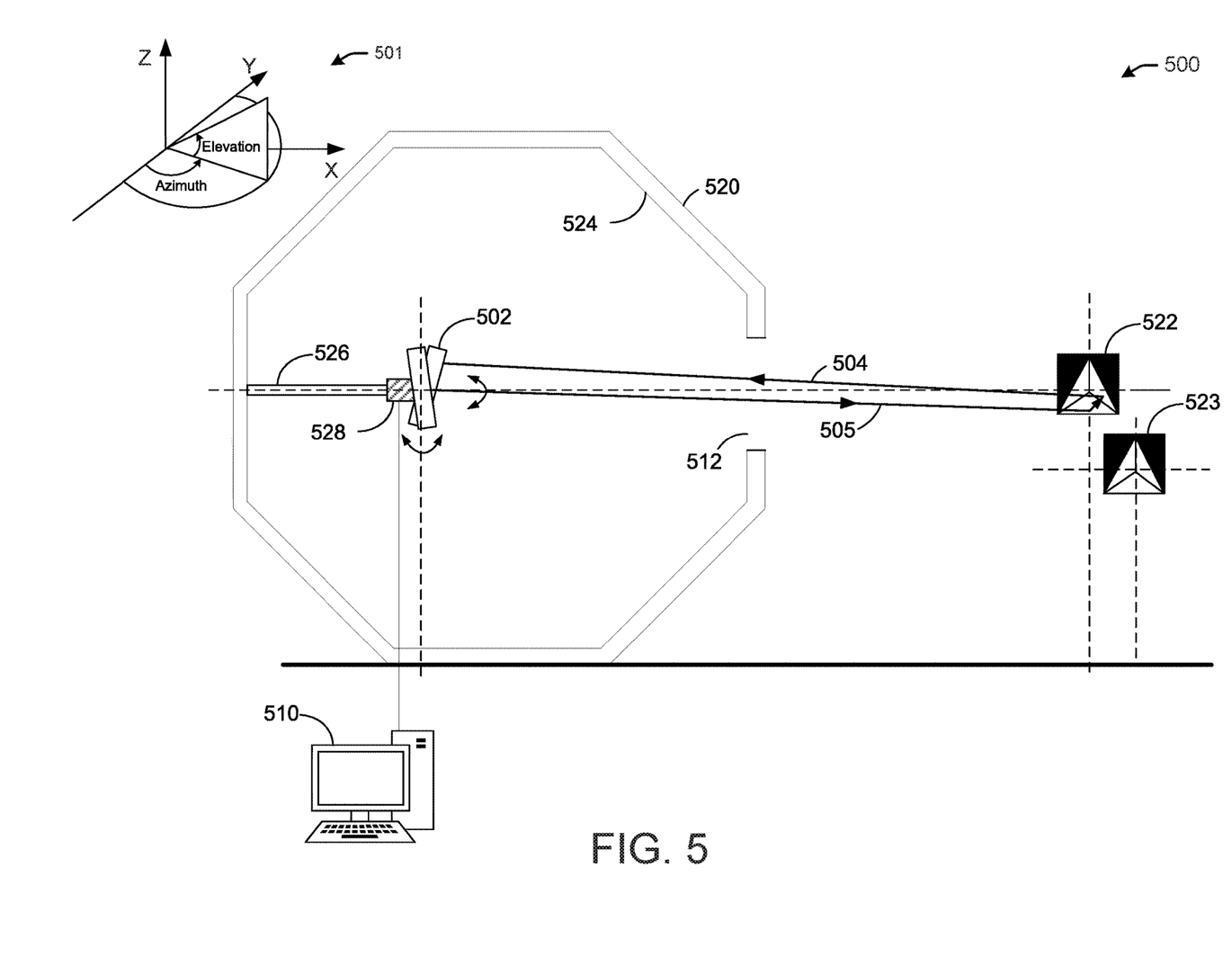
FIG. 5 depicts an illustrative schematic diagram for an enhanced anechoic chamber, in accordance with one or more example embodiments of the present disclosure.

FIG. 5 depicts an illustrative schematic diagram 500 for enhanced anechoic chamber, in accordance with one or more example embodiments of the present disclosure.

Referring to FIG. 5, there is shown an anechoic chamber 520. The walls of the anechoic chamber 520 may be chosen to minimize returned angles from within the chamber. For example, the shape of the anechoic chamber may be selected to avoid the presence of any 90° angles. This is because if normal walls are used, this may result in every corner becoming a corner reflector. Ideally, a spherical shape of the anechoic chamber may result in no angles that may become reflectors. However, implementations may, vary but the purpose is to minimize the presence of any 90° angles.

In one or more embodiments, the anechoic chamber may have interior walls covered with anechoic foam 524.

In one or more embodiments, the anechoic chamber 520 may comprise an aperture 512, allowing signals (e.g., signal 504) to be transmitted from the radar to one or more reflectors (e.g., corner reflector 522 and/or corner reflector 523) that may be placed at a larger distance than the anechoic chamber. That is, radar 502 may be placed inside the anechoic chamber 520 while the target(s) (e.g., corner reflector 522 and/or corner reflector 523). The aperture 512 may be an opening with a space allowing no obstruction between the radar and the targets. A corner reflector or other radar target can then be placed some distance from the anechoic chamber 520, ideally centered in the radar's field of view (FOV) through the aperture 512.

In one or more embodiments, the aperture may be replaced to be fully or partially opaque in order to create an environment for testing the radar 502 while being fully enclosed inside the anechoic chamber 512. For example, instead of using the aperture 512, a digital target simulator may be used. In this case, the digital target simulator may take radar signals received from a radar and then records them into a circular memory. The digital target simulator may then read off a certain phase behind the signal received from the radar, which produces a slight delay between the recording of the received signal and a reflected signal. The digital target simulator may then play that signal back and reflect it towards the radar.

Still referring to FIG. 5, there is shown a mounting arm 526 that is attached to the interior wall of the anechoic chamber 520. The end of the mounting arm 526 may comprise a gimbal setup 528 that is situated to accept a radar 502. The gimbal setup 528 may control the movement of the radar 502. A computer system 510 may be connected to the gimbal setup 528 in order to control it, and to execute one or more routines are for performing specific testing on the radar 502. The gimbal setup 528 may allow movements in various directions. For example, the gimbal setup 528 may facilitate moving the radar 502 in the elevation axis and the azimuth axis (see, coordinate system 501). The radar 502 may then transmit signal(s) 504, which may be reflected by a reflector (e.g., corner reflector 522) as a reflected signal 505, which may be captured by the radar 502. These variations in various angles may allow building a map or sensitivity chart of the radar based on returns from a reflector (e.g., corner reflector 522 and/or corner reflector 523) outside the anechoic chamber.

In one or more embodiments, the computer system 510 may control the gimbal setup 528 to rotate the radar 502. One or more specific tests may be taken by generating a testing script to be run by the computer system 510. For example, an administrator of the anechoic chamber 520 may decide to perform a set of measurements at a certain azimuth angle and a certain elevation. The computer system 510 may control the gimbal setup 528 to vary the rotation of the radar to that certain azimuth and elevation angles. When the radar is at that coordinate, the computer system 510 may activate the radar 502 in order to transmit and then capture return signals. This process may be repeated to create a series of measurements at different azimuth and elevation angles.

In one or more embodiments, the computer system 510 may perform a series of measurements on the radar 502 by varying the elevation angle and/or the azimuth angle based on one or more reflectors (e.g., corner reflector 522 and/or corner reflector 523) placed at a particular position outside of the anechoic chamber 520. This may result in generating a performance pattern of the radar 502 as a complete function of azimuth and elevation. A radar vendor may provide some information, but that information may not be complete.

In one or more embodiments, an enhanced anechoic chamber system may utilize two or more reflectors (e.g., corner reflector 522 and corner reflector 523) to perform testing. For example, while a radar 502 is set up inside the anechoic chamber 520, the corner reflector 522 may be fixed, and the corner reflector 523 may move on a cable or other means to make the reflection transition in a certain direction. This may allow testing of the radar's performance to determine its range resolution. The two reflectors may provide two targets at different ranges. The anechoic chamber 520 may help collect data from the reflected signals from both targets to determine how close these reflectors can be to each other before the radar under test can no longer tell them apart.

In one or more embodiments, an enhanced anechoic chamber system may facilitate performing angular separation measurements. For example, using two reflectors as targets to reflect signals received from a radar under test inside the portable anechoic chamber may allow measurements that may verify that the reflected signals are coming from both reflectors. Angular separation measurement may determine the point at which the reflected signals appear to the radar under test as one return signal.

It is understood that the above descriptions are for purposes of illustration and are not meant to be limiting.

Figure 6:
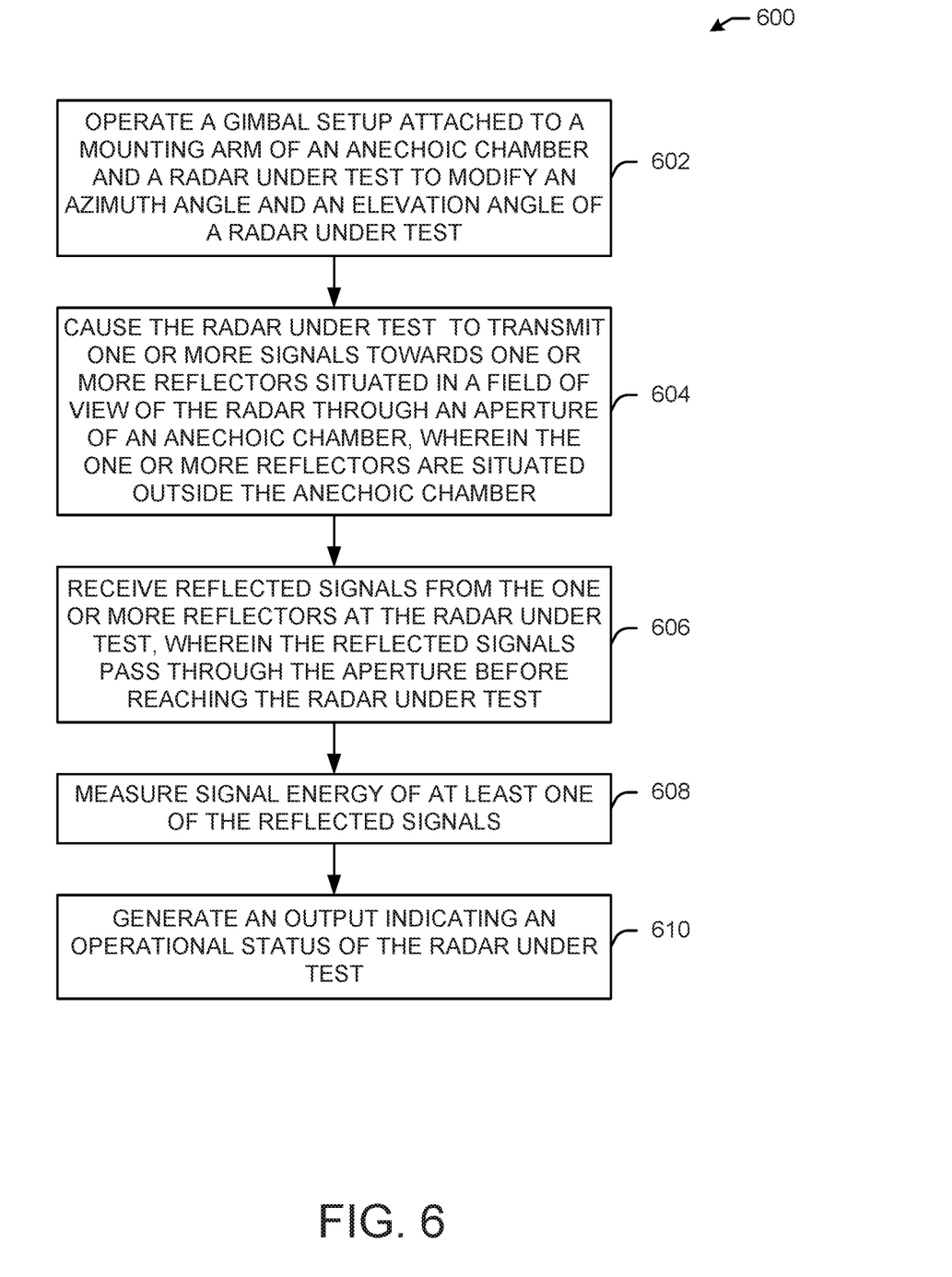
FIG. 6 illustrates a flow diagram of a process for an illustrative enhanced anechoic chamber system, in accordance with one or more example embodiments of the present disclosure.

FIG. 6 illustrates a flow diagram of process 600 for an illustrative enhanced anechoic chamber system, in accordance with one or more example embodiments of the present disclosure.

At block 602, an enhanced anechoic chamber system may operate a gimbal setup attached to a mounting arm of an anechoic chamber and the radar under test to modify an azimuth angle and an elevation angle of a radar under test. The anechoic chamber may comprise an interior surface having anechoic foam. The anechoic chamber may be portable. The anechoic chamber may be comprised of one or more removable platforms. The anechoic chamber may minimize signal noise received by the radar under test inside the anechoic chamber from objects outside the anechoic chamber.

At block 604, the enhanced anechoic chamber system may cause the radar under test to transmit one or more signals towards one or more reflectors situated in a field of view of the radar through an aperture of an anechoic chamber, wherein the one or more reflectors are situated outside the anechoic chamber.

At block 606, the enhanced anechoic chamber system may receive reflected signals from the one or more reflectors at the radar under test, wherein the reflected signals pass through the aperture before reaching the radar under test.

At block 608, the enhanced anechoic chamber system may measure signal energy of at least one of the reflected signals.

At block 610, the enhanced anechoic chamber system may generate an output indicating an operational status of the radar under test.

It is understood that the above descriptions are for purposes of illustration and are not meant to be limiting.

Figure 7:
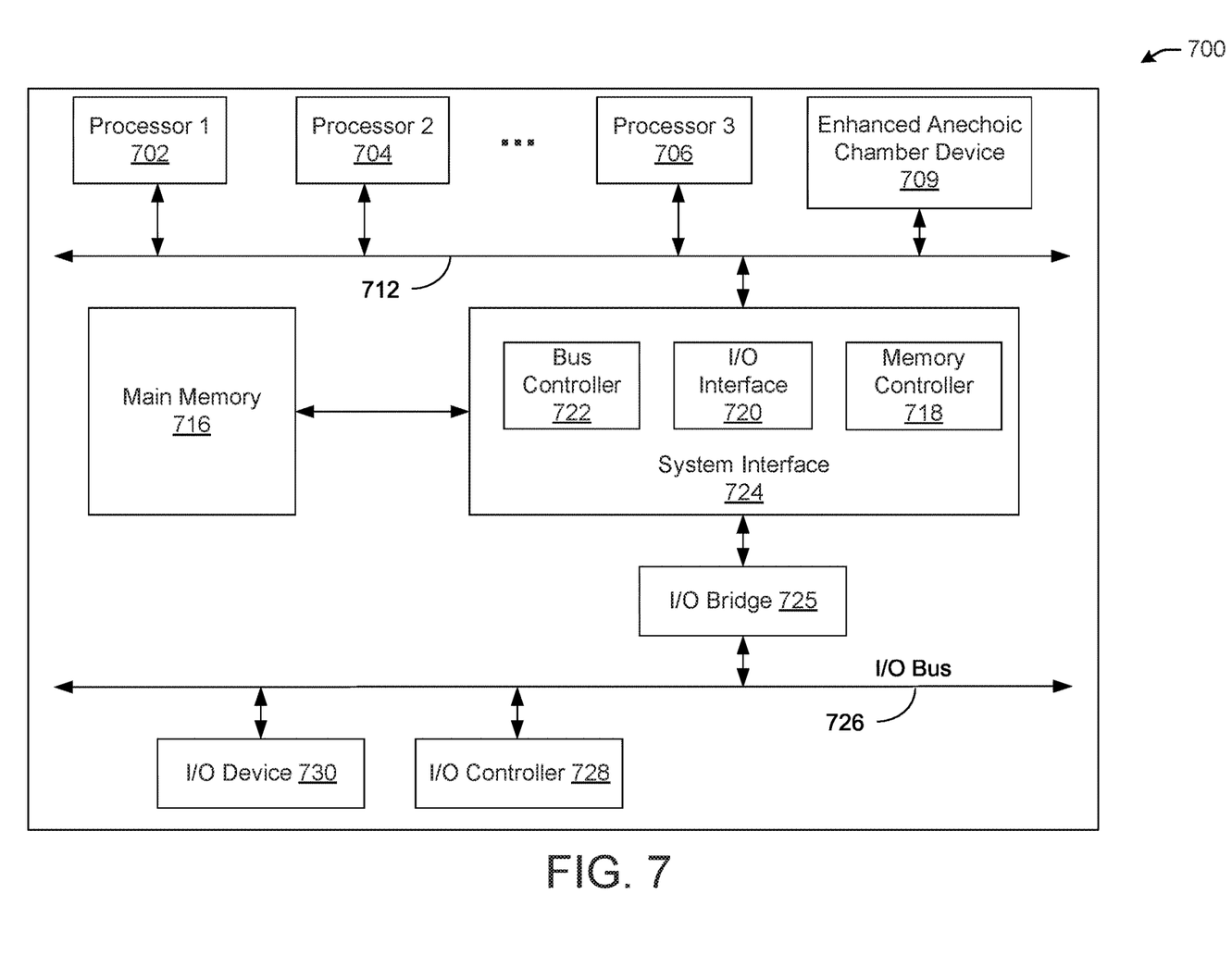
FIG. 7 is a block diagram illustrating an example of a computing device or computer system upon which any of one or more techniques (e.g., methods) may be performed, in accordance with one or more example embodiments of the present disclosure.

FIG. 7 is a block diagram illustrating an example of a computing device or computer system 700 upon which any of one or more techniques (e.g., methods) may be performed, in accordance with one or more example embodiments of the present disclosure.

For example, the computing system 700 of FIG. 7 may represent the one or more processor(s) 132, and/or the one or more measurement devices of FIGS. 2 and 5 (e.g., computer system(s) 210 and 510), and therefore may assess and validate the sensors in the sensor system 110 of FIG. 1. The computer system (system) includes one or more processor(s) 702-706. Processor(s) 702-706 may include one or more internal levels of cache (not shown) and a bus controller (e.g., bus controller 722) or bus interface (e.g., I/O interface 720) unit to direct interaction with the processor bus 712. An enhanced anechoic chamber device 709 may also be in communication with the Processor(s) 702-706 and may be connected to the processor bus 712.

Processor bus 712, also known as the host bus or the front side bus, may be used to couple the processor(s) 702-706 and/or the enhanced anechoic chamber device 709 with the system interface 724. System interface 724 may be connected to the processor bus 712 to interface other components of the system 700 with the processor bus 712. For example, system interface 724 may include a memory controller 718 for interfacing a main memory 716 with the processor bus 712. The main memory 716 typically includes one or more memory cards and a control circuit (not shown). System interface 724 may also include an input/output (I/O) interface 720 to interface one or more I/O bridge(s) 725 or I/O device(s) 730 with the processor bus 712. One or more I/O controllers and/or I/O devices may be connected with the I/O bus 726, such as I/O controller 728 and I/O device 730, as illustrated.

I/O device 730 may also include an input device (not shown), such as an alphanumeric input device, including alphanumeric and other keys for communicating information and/or command selections to the processor(s) 702-706, and/or the enhanced anechoic chamber device 709. Another type of user input device includes cursor control, such as a mouse, a trackball, or cursor direction keys for communicating direction information and command selections to the processor(s) 702-706, and/or the enhanced anechoic chamber device 709, and for controlling cursor movement on the display device.

System 700 may include a dynamic storage device, referred to as main memory 716, or a random access memory (RAM) or other computer-readable devices coupled to the processor bus 712 for storing information and instructions to be executed by the processor(s) 702-706 and/or the enhanced anechoic chamber device 709. Main memory 716 also may be used for storing temporary variables or other intermediate information during execution of instructions by the processor(s) 702-706, and/or the enhanced anechoic chamber device 709. System 700 may include read-only memory (ROM) and/or other static storage device coupled to the processor bus 712 for storing static information and instructions for the processor(s) 702-706, and/or the enhanced anechoic chamber device 709. The system outlined in FIG. 7 is but one possible example of a computer system that may employ or be configured in accordance with aspects of the present disclosure.

According to one embodiment, the above techniques may be performed by computer system 700 in response to processor 704 executing one or more sequences of one or more instructions contained in main memory 716. These instructions may be read into main memory 716 from another machine-readable medium, such as a storage device. Execution of the sequences of instructions contained in main memory 716 may cause processor(s) 702-706, and/or the enhanced anechoic chamber device 709 to perform the process steps described herein. In alternative embodiments, circuitry may be used in place of or in combination with the software instructions. Thus, embodiments of the present disclosure may include both hardware and software components.

Various embodiments may be implemented fully or partially in software and/or firmware. This software and/or firmware may take the form of instructions contained in or on a non-transitory computer-readable storage medium. Those instructions may then be read and executed by one or more processors to enable the performance of the operations described herein. The instructions may be in any suitable form, such as, but not limited to, source code, compiled code, interpreted code, executable code, static code, dynamic code, and the like. Such a computer-readable medium may include any tangible non-transitory medium for storing information in a form readable by one or more computers, such as but not limited to read-only memory (ROM); random access memory (RAM); magnetic disk storage media; optical storage media; a flash memory, etc.

A machine-readable medium includes any mechanism for storing or transmitting information in a form (e.g., software, processing application) readable by a machine (e.g., a computer). Such media may take the form of, but is not limited to, non-volatile media and volatile media and may include removable data storage media, non-removable data storage media, and/or external storage devices made available via a wired or wireless network architecture with such computer program products, including one or more database management products, web server products, application server products, and/or other additional software components. Examples of removable data storage media include Compact Disc Read-Only Memory (CD-ROM), Digital Versatile Disc Read-Only Memory (DVD-ROM), magneto-optical disks, flash drives, and the like. Examples of non-removable data storage media include internal magnetic hard disks, SSDs, and the like. The one or more memory devices 606 (not shown) may include volatile memory (e.g., dynamic random access memory (DRAM), static random access memory (SRAM), etc.) and/or non-volatile memory (e.g., read-only memory (ROM), flash memory, etc.).

Computer program products containing mechanisms to effectuate the systems and methods in accordance with the presently described technology may reside in main memory 716, which may be referred to as machine-readable media. It will be appreciated that machine-readable media may include any tangible non-transitory medium that is capable of storing or encoding instructions to perform any one or more of the operations of the present disclosure for execution by a machine or that is capable of storing or encoding data structures and/or modules utilized by or associated with such instructions. Machine-readable media may include a single medium or multiple media (e.g., a centralized or distributed database, and/or associated caches and servers) that store the one or more executable instructions or data structures.

In one or more embodiments, there may be a system comprising: an anechoic chamber for performing measurement using a radar under test; a mounting arm configured to position the radar under test within the anechoic chamber; an aperture facing the radar under test and configured so that signals from the radar under test pass through the aperture; and a target for reflecting signals towards the radar under test, wherein the target is located outside the anechoic chamber.

The anechoic chamber may comprise an interior surface having anechoic foam. An edge of the aperture may be covered with anechoic foam. The target may be a corner reflector. The anechoic chamber may be portable. The anechoic chamber may be comprised of one or more removable platforms. The anechoic chamber may minimize signal noise received by the radar under test inside the anechoic chamber from objects outside the anechoic chamber.

In one or more embodiments, there may be an apparatus, the apparatus comprising processing circuitry coupled to storage, the processing circuitry configured to: operate a gimbal setup attached to a mounting arm of an anechoic chamber and a radar under test to modify an azimuth angle and an elevation angle of a radar under test; cause the radar under test to transmit one or more signals towards one or more reflectors situated in a field of view of the radar through an aperture of an anechoic chamber, wherein the one or more reflectors are situated outside the anechoic chamber; receive reflected signals from the one or more reflectors at the radar under test, wherein the reflected signals pass through the aperture before reaching the radar under test; measure signal energy of at least one of the reflected signals; and generate an output indicating an operational status of the radar under test.

The anechoic chamber may comprise an interior surface having anechoic foam. An edge of the aperture may be covered with anechoic foam. At least one reflector of the one or more reflectors may be a corner reflector. The anechoic chamber may be portable. The anechoic chamber may be comprised of one or more removable platforms. The anechoic chamber may minimize signal noise received by the radar under test inside the anechoic chamber from objects outside the anechoic chamber.

In one or more embodiments, there may be a non-transitory computer-readable medium storing computer-executable instructions which when executed by one or more processors result in performing operations comprising: operating a gimbal setup attached to a mounting arm of an anechoic chamber and a radar under test to modify an azimuth angle and an elevation angle of a radar under test; causing the radar under test to transmit one or more signals towards one or more reflectors situated in a field of view of the radar through an aperture of an anechoic chamber, wherein the one or more reflectors are situated outside the anechoic chamber; receiving reflected signals from the one or more reflectors at the radar under test, wherein the reflected signals pass through the aperture before reaching the radar under test; measuring signal energy of at least one of the reflected signals; and generating an output indicating an operational status of the radar under test.

The anechoic chamber may comprise an interior surface having anechoic foam. An edge of the aperture may be covered with anechoic foam. At least one reflector of the one or more reflectors may be a corner reflector. The anechoic chamber may be portable. The anechoic chamber may be comprised of one or more removable platforms.

Embodiments of the present disclosure include various steps, which are described in this specification. The steps may be performed by hardware components or may be embodied in machine-executable instructions, which may be used to cause a general-purpose or special-purpose processor programmed with the instructions to perform the steps. Alternatively, the steps may be performed by a combination of hardware, software, and/or firmware.

Various modifications and additions can be made to the exemplary embodiments discussed without departing from the scope of the present invention. For example, while the embodiments described above refer to particular features, the scope of this invention also includes embodiments having different combinations of features and embodiments that do not include all of the described features. Accordingly, the scope of the present invention is intended to embrace all such alternatives, modifications, and variations together with all equivalents thereof.

The operations and processes described and shown above may be carried out or performed in any suitable order as desired in various implementations. Additionally, in certain implementations, at least a portion of the operations may be carried out in parallel. Furthermore, in certain implementations, less than or more than the operations described may be performed.

The word "exemplary" is used herein to mean "serving as an example, instance, or illustration." Any embodiment described herein as "exemplary" is not necessarily to be construed as preferred or advantageous over other embodiments.

As used herein, unless otherwise specified, the use of the ordinal adjectives "first," "second," "third," etc., to describe a common object, merely indicates that different instances of like objects are being referred to and are not intended to imply that the objects so described must be in a given sequence, either temporally, spatially, in ranking, or any other manner.

It is understood that the above descriptions are for purposes of illustration and are not meant to be limiting.

Although specific embodiments of the disclosure have been described, one of ordinary skill in the art will recognize that numerous other modifications and alternative embodiments are within the scope of the disclosure. For example, any of the functionality and/or processing capabilities described with respect to a particular device or component may be performed by any other device or component. Further, while various illustrative implementations and architectures have been described in accordance with embodiments of the disclosure, one of ordinary skill in the art will appreciate that numerous other modifications to the illustrative implementations and architectures described herein are also within the scope of this disclosure.

Although embodiments have been described in language specific to structural features and/or methodological acts, it is to be understood that the disclosure is not necessarily limited to the specific features or acts described. Rather, the specific features and acts are disclosed as illustrative forms of implementing the embodiments. Conditional language, such as, among others, "can," "could," "might," or "may," unless specifically stated otherwise, or otherwise understood within the context as used, is generally intended to convey that certain embodiments could include, while other embodiments do not include, certain features, elements, and/or steps. Thus, such conditional language is not generally intended to imply that features, elements, and/or steps are in any way required for one or more embodiments or that one or more embodiments necessarily include logic for deciding, with or without user input or prompting, whether these features, elements, and/or steps are included or are to be performed in any particular embodiment.

What is claimed is:

1. A system, comprising:
an anechoic chamber configured to facilitate a measurement using a radar that is under test;
a mounting arm disposed inside the anechoic chamber so as to extend inwards from an internal sidewall of the anechoic chamber and configured to removably position the radar at a location within the anechoic chamber;

an aperture formed through a sidewall of the anechoic chamber, the sidewall being shaped to allow signals transmitted from the radar to travel from an area inside the anechoic chamber, pass through the aperture, and travel to an area outside of the anechoic chamber;

an anechoic material covering an edge of the aperture and configured to reduce diffraction by the edge of the aperture;

a target provided to reflect at least one of said signals back towards the radar positioned within the anechoic chamber, wherein the target is located outside the anechoic chamber at a location within a radar field of view through the aperture and wherein at least one of said signals, reflected by the target during the test, pass through the aperture before reaching the radar.

2. The system of claim 1, wherein the anechoic chamber comprises an interior surface having anechoic foam.

3. The system of claim 1, wherein the target is a corner reflector.

4. The system of claim 1, wherein the anechoic chamber further comprises an object removably mounted in front of the radar in a manner that allows the object and radar to be collectively controlled as one unit movable in space.

5. The system of claim 1, wherein the anechoic chamber is comprised of a first half portion and a second half portion that are completely detachable from one another to allow access to an interior of the anechoic chamber for placing the radar on the mounting arm.

6. The system of claim 5, wherein the mounting arm is disposed in the first half portion of the anechoic chamber and the aperture is formed in the second half portion of the anechoic chamber.

7. An apparatus, the apparatus comprising processing circuitry coupled to storage, the processing circuitry configured to:

operate a gimbal setup attached to a mounting arm disposed inside an anechoic chamber and a radar to modify an azimuth angle and an elevation angle of the radar, wherein the mounting arm removably positions the radar that is under test within the anechoic chamber;

cause the radar to transmit one or more signals towards one or more reflectors situated in a field of view of the radar through an aperture formed through a sidewall of the anechoic chamber, wherein the one or more reflectors are situated outside the anechoic chamber and the sidewall is shaped to allow one or more signals to travel from an area inside the anechoic chamber to an area outside of the anechoic chamber via the aperture;

using an anechoic material to reduce diffraction by an edge of the aperture, wherein the anechoic material covers an edge of the aperture;

receive reflected signals from the one or more reflectors at the radar, wherein the reflected signals pass through the aperture before reaching the radar;

measure signal energy of at least one of the reflected signals; and generate an output indicating an operational status of the radar.

8. The apparatus of claim 7, wherein the anechoic chamber comprises an interior surface having anechoic foam.

9. The apparatus of claim 7, wherein at least one reflector of the one or more reflectors is a corner reflector.

10. The apparatus of claim 7, wherein the anechoic chamber is portable.

11. The apparatus of claim 7, wherein the anechoic chamber is comprised of one or more removable platforms.

12. The apparatus of claim 7, wherein the anechoic chamber minimizes signal noise received by the radar inside the anechoic chamber from objects outside the anechoic chamber.

13. A non-transitory computer-readable medium storing computer-executable instructions which when executed by one or more processors result in performing operations comprising:

operating a gimbal setup attached to a mounting arm disposed inside an anechoic chamber and a radar to modify an azimuth angle and an elevation angle of the radar, wherein the mounting arm removably positions the radar that is under test within the anechoic chamber;

causing the radar to transmit one or more signals towards one or more reflectors situated in a field of view of the radar through an aperture formed through a sidewall of the anechoic chamber, wherein the one or more reflectors are situated outside the anechoic chamber, and the sidewall is shaped to allow the one or more signals to travel from an area inside the anechoic chamber to an area outside of the anechoic chamber via the aperture, and diffraction by an edge of the aperture is reduced via an anechoic material covering the edge;

receiving reflected signals from the one or more reflectors at the radar, wherein the reflected signals pass through the aperture before reaching the radar;

measuring signal energy of at least one of the reflected signals; and generating an output indicating an operational status of the radar.

14. The non-transitory computer-readable medium of claim 13, wherein the anechoic chamber comprises an interior surface having anechoic foam.

15. The non-transitory computer-readable medium of claim 13, wherein at least one reflector of the one or more reflectors is a corner reflector.

16. The non-transitory computer-readable medium of claim 13, wherein the anechoic chamber is portable.

17. The non-transitory computer-readable medium of claim 13, wherein the anechoic chamber is comprised of one or more removable platforms.

* * * * *